United States Patent
Yoshiba et al.

(10) Patent No.: US 8,718,123 B2
(45) Date of Patent: May 6, 2014

(54) TEST APPARATUS AND TEST METHOD

(75) Inventors: Kazumichi Yoshiba, Gunma (JP); Hiromi Oshima, Gunma (JP)

(73) Assignee: Advantest Corporation, Tokyo (JP)

( * ) Notice: Subject to any disclaimer, the term of this patent is extended or adjusted under 35 U.S.C. 154(b) by 187 days.

(21) Appl. No.: 13/445,932

(22) Filed: Apr. 13, 2012

(65) Prior Publication Data

US 2012/0300826 A1 Nov. 29, 2012

(30) Foreign Application Priority Data

May 27, 2011 (JP) .................................. 2011-119661

(51) Int. Cl.
- H04B 3/46 (2006.01)
- H04B 17/00 (2006.01)
- H04Q 1/20 (2006.01)
- G01R 31/28 (2006.01)
- G06F 11/00 (2006.01)

(52) U.S. Cl.
USPC .............................. 375/226; 714/735; 714/744

(58) Field of Classification Search
None
See application file for complete search history.

(56) References Cited

U.S. PATENT DOCUMENTS 7,644,324 B2  1/2010  Arasawa

FOREIGN PATENT DOCUMENTS

| JP | 2008-4237 A | 1/2008 |
| JP | 2010-165422 A | 7/2010 |
| JP | 4714306 B1 | 6/2011 |
| WO | 2008/007636 A1 | 1/2008 |
| WO | 2010/064312 A1 | 6/2010 |
| WO | 2011/061796 A1 | 5/2011 |

OTHER PUBLICATIONS

"Notice of Reasons for Rejection" issued by the Japanese Patent Office for application No. 2011-119661 on Apr. 30, 2013.
Notice of Office Action for Appl. No. 10-2012-0043441, issued by the Korean Intellectual Property Office on Jun. 27, 2013.

*Primary Examiner* — Guerrier Merant

(57) ABSTRACT

A test apparatus that tests a device under test exchanging a data signal and a clock signal, the test apparatus comprising a test signal supplying section that supplies the device under test with a data signal and a clock signal, as a test signal; a data acquiring section that acquires the data signal output by the device under test, at a timing corresponding to the clock signal output by the device under test; a judging section that judges pass/fail of the device under test based on a comparison result of a comparison between the data signal acquired by the data acquiring section and an expected value; and an adjusting section that, when performing an adjustment, adjusts a delay amount of the clock signal used to generate the timing at which the data signal is acquired.

3 Claims, 11 Drawing Sheets

TEST APPARATUS AND TEST METHOD

BACKGROUND

1. Technical Field

The present invention relates to a test apparatus and a test method.

2. Related Art

An interface is known that is referred to as "source-synchronous," in which a clock signal is output in synchronization with a data signal. Patent Document 1 describes a test apparatus that tests a device under test adopting such an interface. The test apparatus in Patent Document 1 samples the data value of a data signal using a clock signal output from the device under test, and compares the sampled data value to an expected value.

Patent Document 1: U.S. Pat. No. 7,644,324

A source-synchronous interface transmits a data signal and a clock signal in parallel via different transmission paths. Accordingly, when the delay amount of the transmission path transmitting the data signal is different from the delay amount of the transmission path transmitting the clock signal, the test apparatus cannot perform accurate testing.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. According to a first aspect related to the innovations herein, provided is a test apparatus that tests a device under test exchanging, with the test apparatus, a data signal and a clock signal indicating a timing at which the data signal is to be sampled, via a bidirectional bus, the test apparatus comprising a test signal supplying section that supplies the device under test with a data signal and a clock signal, as a test signal, via the bidirectional bus; a data acquiring section that acquires the data signal output via the bidirectional bus by the device under test, at a timing corresponding to the clock signal output via the bidirectional bus by the device under test; a judging section that judges pass/fail of the device under test based on a comparison result of a comparison between the data signal acquired by the data acquiring section and an expected value; and an adjusting section that, when performing an adjustment, causes the test signal supplying section to output an adjustment data signal and an adjustment clock signal, causes the data acquiring section to acquire the adjustment data signal at a timing corresponding to the adjustment clock signal, and adjusts a delay amount of the clock signal used to generate the timing at which the data signal is acquired, based on an acquisition result of the adjustment data signal by the data acquiring section. Also provided is a test method.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
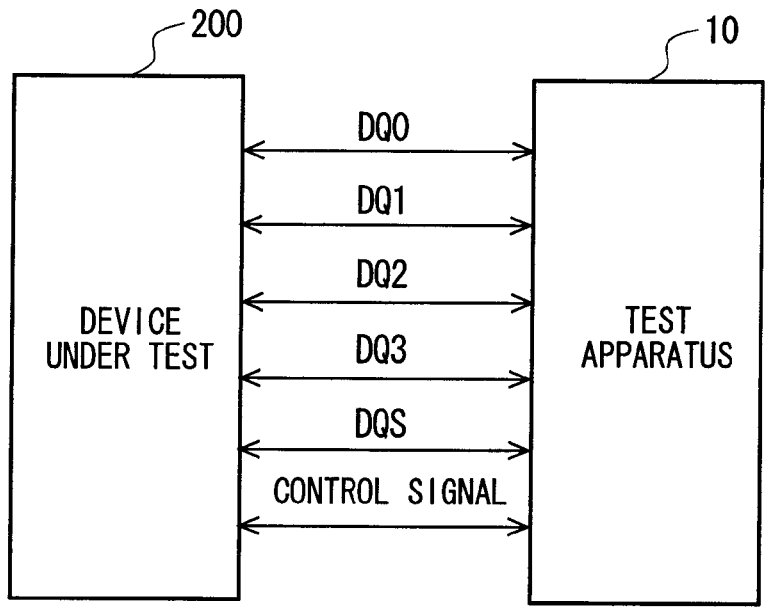
FIG. 1 shows a device under test 200 and a test apparatus 10 that tests the device under test 200, according to an embodiment of the present invention.
Figure 2:
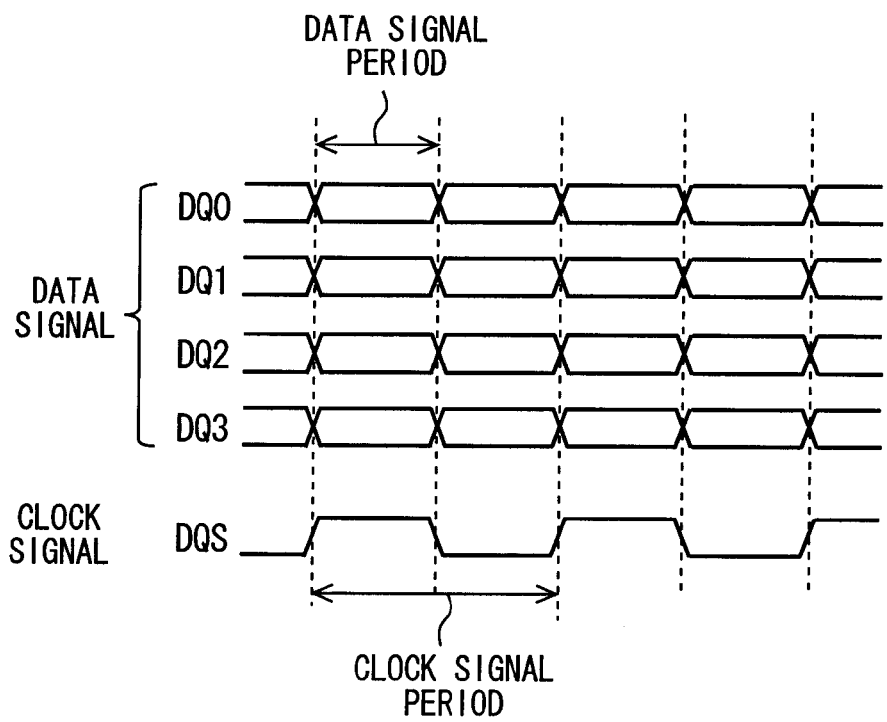
FIG. 2 shows timings of a data signal and clock signal output from the device under test 200.

FIG. 1 shows a device under test 200 and a test apparatus 10 that tests the device under test 200, according to an embodiment of the present invention. FIG. 2 shows timings of a data signal and clock signal output from the device under test 200.

The test apparatus 10 according to the present embodiment tests the device under test 200. In the present embodiment, the device under test 200 exchanges data with another device via a DDR (Double Data Rate) interface, which is a bidirectional bus.

The DDR interface transmits a plurality of data signals DQ and a clock signal DQS, which indicates the timing at which the data signals DQ are sampled, in parallel. In the present example, as shown in FIG. 2, the DDR interface transmits one clock signal DQS for four data signals DQ0, DQ1, DQ2, and DQ3. Furthermore, the DDR interface transmits the data signals DQ at a rate that is twice the rate of the clock signal DQS and synchronized with the clock signal DQS.

In the present embodiment, the device under test 200 is a non-volatile memory device, for example, and writes and reads data to and from another control device via the DDR interface. The test apparatus 10 of the present embodiment tests the device under test 200 by exchanging the data signals DQ and clock signal DQS with the device under test 200 via the DDR interface, which is a bidirectional bus. Furthermore, the test apparatus 10 exchanges control signals, such as write enable signals and read enable signals, with the device under test 200.

Figure 3:
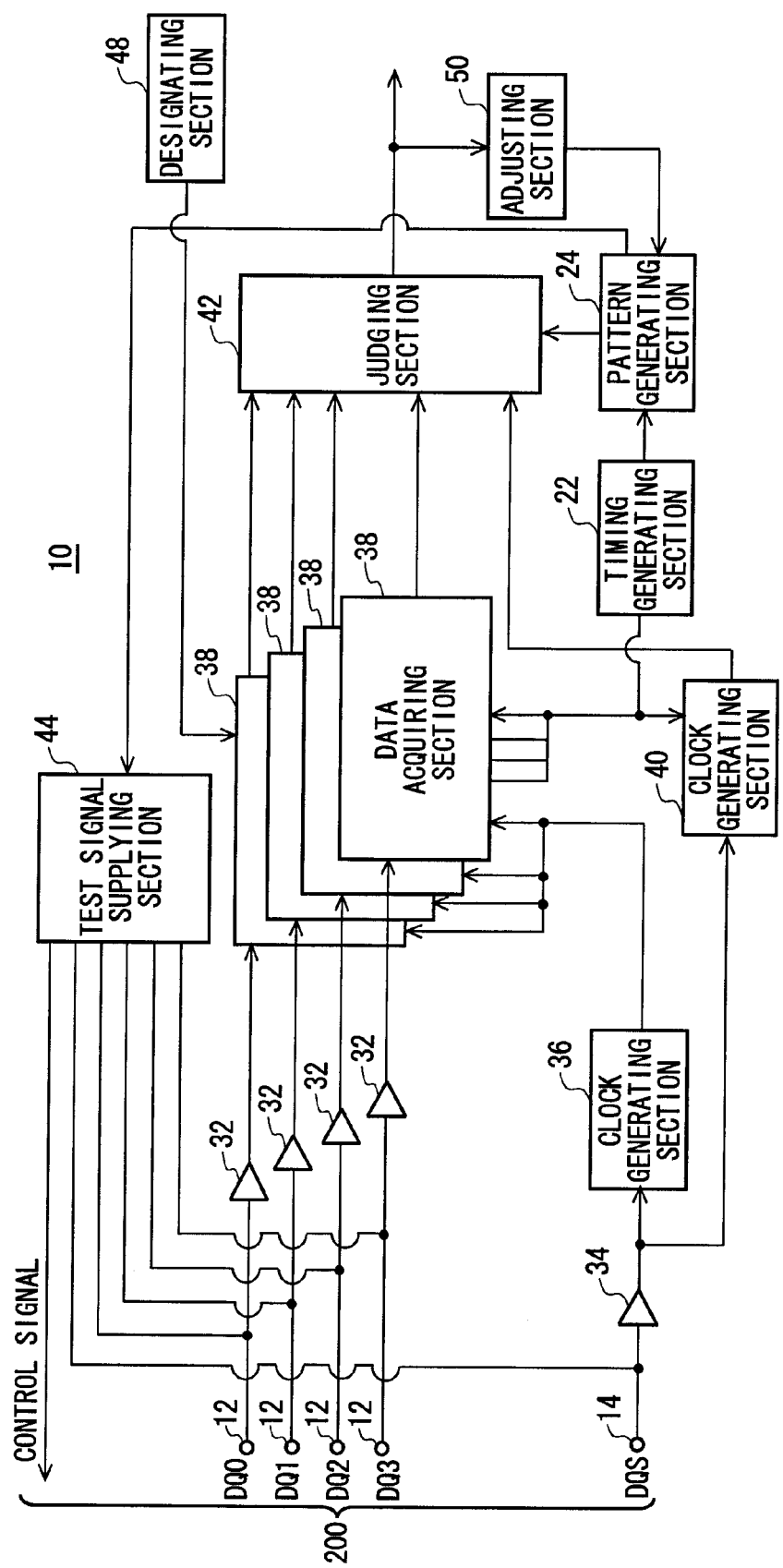
FIG. 3 shows a configuration of the test apparatus 10 according to the present embodiment.

FIG. 3 shows a configuration of the test apparatus 10 according to the present embodiment. The test apparatus 10 includes a plurality of data terminals 12, a clock terminal 14, a timing generating section 22, a pattern generating section 24, a plurality of data comparators 32, a clock comparator 34, a clock generating section 36, a plurality of data acquiring sections 38, a clock acquiring section 40, a judging section 42, a test signal supplying section 44, a designating section 48, and an adjusting section 50.

Each data terminal 12 is connected to an input/output terminal for a data signal in the device under test 200, via the DDR interface that is a bidirectional bus. In this example, the test apparatus 10 includes four data terminals 12. The four data terminals 12 are connected respectively to the input/output terminals for the four data signals DQ0, DQ1, DQ2, and DQ3 of the device under test 200, via the DDR interface. The clock terminal 14 is connected to an input/output terminal for the clock signal DQS of the device under test 200, via the DDR interface.

The timing generating section 22 generates a timing signal corresponding to the test period of the test apparatus 10, based on a reference clock generated within the test apparatus 10. The timing generating section 22 may generate a timing signal synchronized with the test period, for example.

The pattern generating section 24 generates an expected value pattern representing the expected value of the data signal to be output form the device under test 200. The pattern generating section 24 generates a test pattern representing a waveform of a test signal to be supplied to the device under test 200. The pattern generating section 24 may generate the expected value pattern and the test pattern according to the execution of a test program, for example.

The data comparators 32 are provided to correspond respectively to the data signals exchanged with the device under test 200 via the DDR interface. In the present example, the test apparatus 10 includes four data comparators 32 corresponding respectively to the four data signals DQ0, DQ1, DQ2, and DQ3. Each data comparator 32 receives the corresponding data signal output from the device under test 200, via the corresponding data terminal 12. Each data comparator 32 compares the received data signal to a predetermined threshold level to convert the data signal into a logic value, and outputs the data signal as a logic value.

The clock comparator 34 is provided to correspond to the clock signal DQS exchanged with the device under test 200 via the DDR interface. The clock comparator 34 receives the corresponding clock signal output from the device under test 200 via the corresponding clock terminal 14. The clock comparator 34 compares the received clock signal to a predetermined threshold level to convert the clock signal into a logic value, and outputs the clock signal as a logic value.

The clock generating section 36 generates a sampling clock for sampling the data signals output from the device under test 200, based on the clock signal expressed as a logic value from the clock comparator 34. In this example, the clock generating section 36 generates a sampling clock having a rate that is twice that of the clock signal.

The data acquiring sections 38 are provided to correspond respectively to the data signals output by the device under test 200 via the DDR interface. In this example, the test apparatus 10 includes four data acquiring sections 38 corresponding respectively to the four data signals DQ0, DQ1, DQ2, and DQ3.

The data acquiring sections 38 acquire the data signals output by the device under test 200 at a timing of the sampling clock corresponding to the clock signal, or at a timing of the timing signal corresponding to the test period of the test apparatus 10. In the present embodiment, each data acquiring section 38 acquires the data value of the corresponding data signal at the timing of the sampling clock generated by the clock generating section 36, or at the timing of the timing signal generated by the timing generating section 22. The data acquiring sections 38 switch between acquiring the data signals at the timing of the sampling clock or at the timing of the timing signal, according to a designation by the designating section 48.

Each data acquiring section 38 outputs the acquired data signal at a timing of the timing signal generated within the test apparatus 10. In the present embodiment, each data acquiring section 38 outputs the data value of the data signal acquired at the timing of the timing signal generated by the timing generating section 22.

Therefore, each data acquiring section 38 can acquire the data signal output from the device under test 200 at a timing corresponding to the clock signal output from the device under test 200, and can output the acquired clock at a timing synchronized with the reference clock within the test apparatus 10. In this case, each data acquiring section 38 can switch the clock of the data signal from being synchronized with the clock signal output from the device under test 200 to being synchronized with the reference clock generated within the test apparatus 10. Furthermore, each data acquiring section 38 can acquire the data signal output from the device under test 200 at a timing synchronized with the reference clock within the test apparatus 10.

The clock acquiring section 40 is provided to correspond to the clock signal DQS output by the device under test 200 via the DDR interface. The clock acquiring section 40 acquires the clock signal output by the device under test 200, at the timing of the timing signal corresponding to the test period of the test apparatus 10. When the test apparatus 10 tests whether the device under test 200 is correctly outputting the clock signal, the clock acquiring section 40 acquires the clock signal at a timing of the timing signal corresponding to the test period of the test apparatus 10. In the present embodiment, the clock acquiring section 40 acquires a logic value representing the level of the corresponding clock signal, at a timing of the timing signal generated by the timing generating section 22.

The judging section 42 judges pass/fail of the device under test 200 based on the results of a comparison between the data signals respectively acquired by the data acquiring sections 38 and the expected value. In the present embodiment, the judging section 42 compares the data value of the data signals output respectively from the data acquiring sections 38 to the expected value indicated by an expected value pattern generated by the judging section 42. In the present embodiment, the judging section 42 judges the device under test 200 to be a pass when the data values of the data signal acquired by the data acquiring sections 38 each match the expected value.

Furthermore, when the test apparatus 10 tests whether the device under test 200 is correctly outputting the clock signal, the judging section 42 compares the logic value of the clock signal acquired by the clock acquiring section 40 to an expected value. In this case, the judging section 42 judges the device under test 200 to be correctly outputting the clock signal when each logic value of the clock signal acquired by the clock acquiring section 40 matches the expected value.

The test signal supplying section 44 supplies the test signal to the device under test 200 according to the test pattern generated by the pattern generating section 24. In the present embodiment, the test signal supplying section 44 outputs a plurality of data signals as the test signal to the device under test 200, via the DDR interface that is a bidirectional bus, and a clock signal indicating the sampling timing of the output data signals to the device under test 200 via the DDR interface. In other words, the test signal supplying section 44 outputs the data signals DQ0, DQ1, DQ2, and DQ3 to the device under test 200 via the data terminals 12, and outputs the clock signal DQS to the device under test 200 via the clock terminal 14.

Furthermore, the test signal supplying section 44 supplies the device under test 200 with a read enable signal that permits data output, as a control signal. As a result, the test signal supplying section 44 can cause the data signals DQ including data stored in the device under test 200 to be output from the device under test 200 via the DDR interface.

The designating section 48 designates whether the data acquiring sections 38 acquire the data signals at a timing corresponding to the timing signal, or at a timing corresponding to the sampling clock. For example, the designating section 48 may designate whether the data acquiring sections 38 acquire the data signals at a timing corresponding to the timing signal, or at a timing corresponding to the sampling clock, according to the execution of a test program.

The adjusting section 50 adjusts the test apparatus 10 prior to testing. More specifically, prior to testing, the adjusting section 50 checks whether the buffers within the data acquiring sections 38 are operating correctly. Furthermore, prior to testing, the adjusting section 50 adjusts the delay amount of the clock signal, which is delayed due to the generation of the sampling clock for acquiring the data signals output from the device under test 200.

Figure 4:
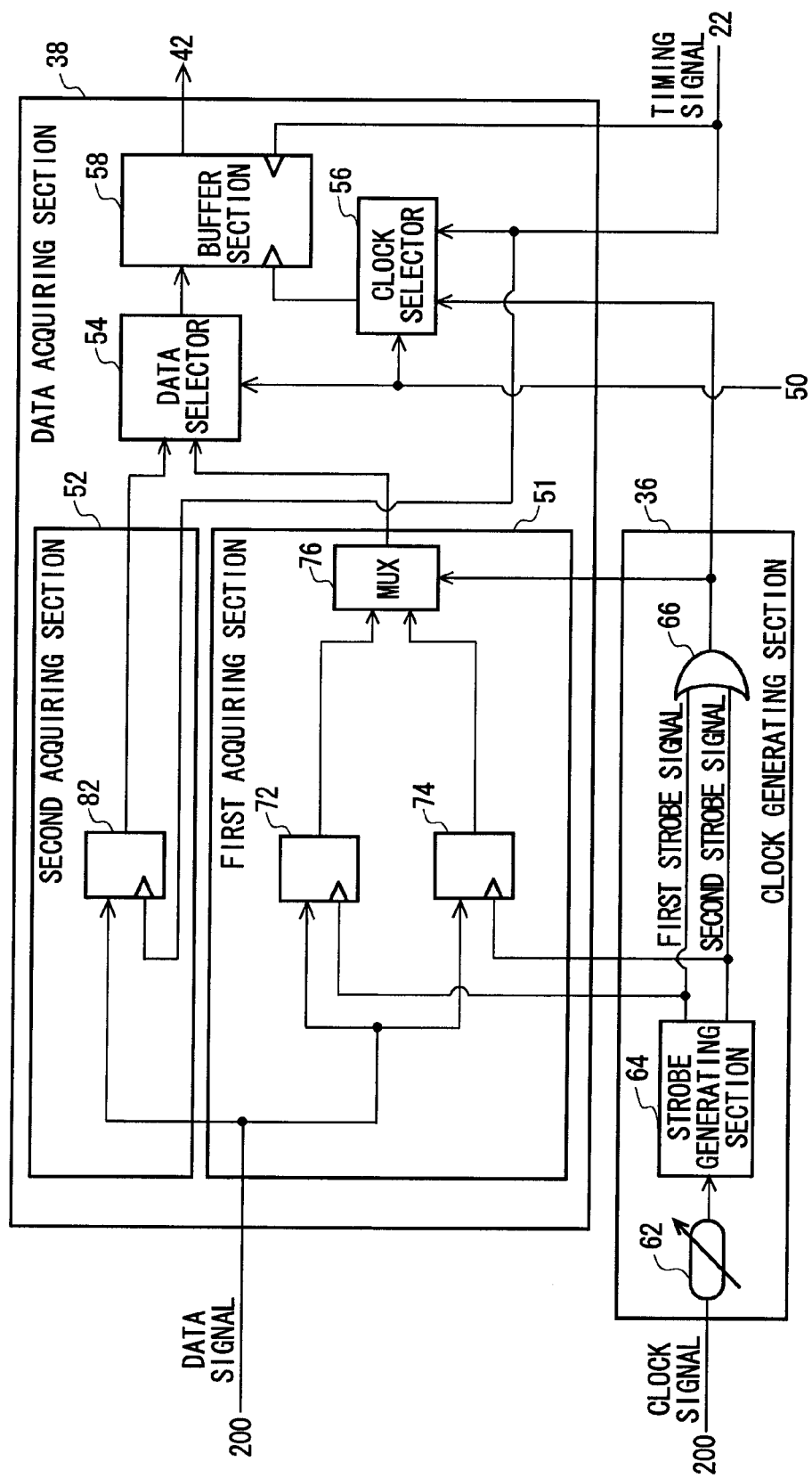
FIG. 4 shows exemplary configurations of the clock generating section 36 and a data acquiring section 38.
Figure 5:
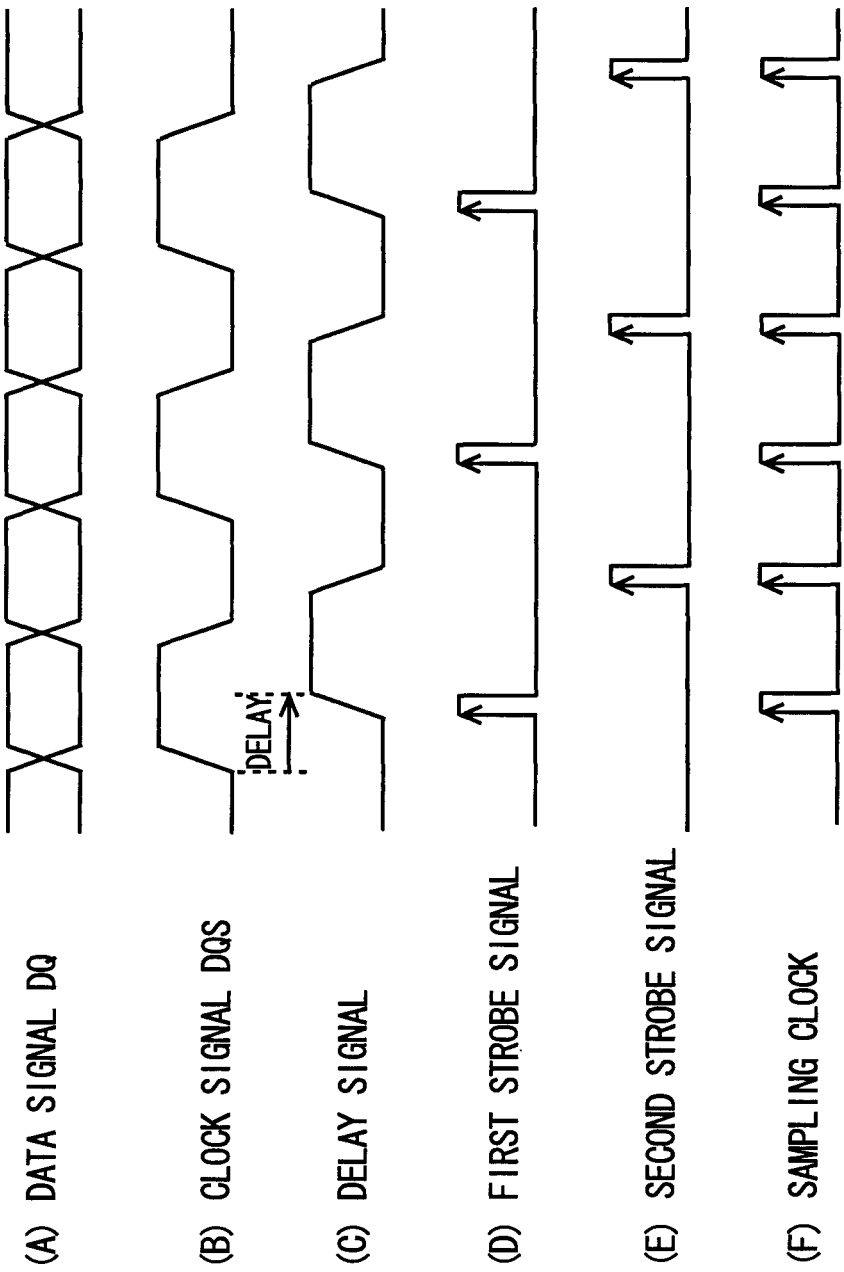
FIG. 5 shows exemplary timings of a data signal, a clock signal, a delay signal, a first strobe signal, a second strobe signal, and a sampling clock.

FIG. 4 shows exemplary configurations of the clock generating section 36 and a data acquiring section 38. FIG. 5 shows exemplary timings of a data signal, a clock signal, a delay signal, a first strobe signal, a second strobe signal, and a sampling clock.

The data acquiring section 38 inputs a data signal including a data value to be transmitted at a predetermined data rate, as shown by (A) in FIG. 5. The data acquiring section 38 sequentially samples the data value included in the data signal DQ, at the timing of the sampling clock generated by the clock generating section 36.

The clock generating section 36 includes a delay device 62, a strobe generating section 64, and a combining section 66, for example. The delay device 62 receives from the device under test 200 a clock signal DQS with a rate that is twice that of the data signal DQ, such as shown by (B) in FIG. 5. The delay device 62 outputs a delay signal obtained by temporally delaying the received clock signal DQS by ¼ the period of the clock signal DQS, such as shown by (C) in FIG. 5.

The strobe generating section 64 generates a first strobe signal having a pulse with a very small time width at the rising edge of the delay signal, such as shown by (D) in FIG. 5. In this way, the clock generating section 36 can output the first strobe indicating the timing at which the odd-numbered data values of the data signal DQ are to be sampled.

The strobe generating section 64 generates a second strobe signal having a pulse with a very small time width at the falling edge of the delay signal, such as shown by (E) in FIG. 5. In this way, the clock generating section 36 can output the second strobe indicating the timing at which the even-numbered data values of the data signal DQ are to be sampled. Instead, the first strobe signal may indicate the timings at which the even-numbered data values of the data signal DQ are to be sampled and the second strobe signal may indicate the timings at which the odd-numbered data values of the data signal DQ are to be sampled.

The combining section 66 outputs a sampling clock obtained by combining the first strobe signal and the second strobe signal, as shown by (F) in FIG. 5. For example, the combining section 66 outputs a sampling clock obtained by calculating the OR of the first strobe signal and the second strobe signal. In this way, the combining section 66 can output a sampling clock indicating a timing that is substantially in the center of the eye opening between data values included in the data signal DQ.

The data acquiring section 38 includes a first acquiring section 51, a second acquiring section 52, a data selector 54, a clock selector 56, and a buffer section 58. The first acquiring section 51 acquires the data value of the data signal DQ shown in (A) of FIG. 5, at the timing of the sampling clock shown in (F) of FIG. 5. The first acquiring section 51 includes an odd-number flip-flop 72, an even-number flip-flop 74, and a multiplexer 76, for example.

The odd-number flip-flop 72 acquires the data value of the data signal DQ output from the device under test 200, at the timing of the first strobe signal, and holds these data values therein. The even-number flip-flop 74 acquires the data value of the data signal DQ output from the device under test 200, at the timing of the second strobe signal, and holds these data values therein.

The multiplexer 76 selects the data values of the data signal DQ held in the odd-number flip-flop 72 and the data values of the data signal DQ held in the even-number flip-flop 74 alternately at the timing of the sampling clock, and supplies the selected values to the buffer section 58 via the data selector 54. In this way, the first acquiring section 51 can acquire the data value of the data signal DQ at the timing corresponding to the sampling clock generated by the clock generating section 36.

The second acquiring section 52 acquires the logic value of the data signal DQ shown by (A) in FIG. 5, at a timing corresponding to the timing signal generated by the timing generating section 22. The rate of the timing signal generated by the timing generating section 22 may be higher than the rates of the clock signal DQS and the data signal DQ output from the device under test 200, for example. In this case, the second acquiring section 52 can acquire a data sequence representing a waveform of the data signal DQ.

The second acquiring section 52 includes at least one flip-flop 82, for example. The flip-flop 82 acquires the data value of the data signal DQ at a timing of the timing signal generated by the timing generating section 22.

The data selector 54 selects either the data value acquired by the first acquiring section 51 or the data value acquired by the second acquiring section 52, according to the designation by the designating section 48, and supplies the buffer section 58 with the selected data value. When the designating section 48 designates that the data signal is to be acquired at a timing corresponding to the sampling clock, the data selector 54 transmits the data value output from the first acquiring section 51 to the buffer section 58. When the designating section 48 designates that the data signal is to be acquired at a timing corresponding to the timing signal, the data selector 54 transmits the data value output from the second acquiring section 52 to the buffer section 58.

The clock selector 56 selects one of the sampling clock generated by the clock generating section 36 and the timing signal generated by the timing generating section 22, according to the designation by the designating section 48, and supplies the buffer section 58 with the selected signal. When the designating section 48 designates that the data signal is to be acquired at a timing corresponding to the sampling clock, the clock selector 56 supplies the buffer section 58 with the sampling clock generated by the clock generating section 36. When the designating section 48 designates that the data signal is to be acquired at a timing corresponding to the timing signal, the clock selector 56 supplies the buffer section 58 with the timing signal generated by the timing generating section 22.

The buffer section 58 includes a plurality of entries. The buffer section 58 buffers the data values transmitted from the data selector 54 sequentially in the plurality of entries, according to the timing of the signal output from the clock selector 56.

In other words, when the designating section 48 designates that the data signal DQ is to be acquired at a timing corresponding to the sampling clock, the buffer section 58 buffers the data values of the data signal DQ output by the multiplexer 76 of the first acquiring section 51 sequentially in the entries thereof, at a timing of the sampling clock generated by the clock generating section 36. When the designating section 48 designates that the data signal DQ is to be acquired at a timing corresponding to the timing signal, the buffer section 58 buffers the data values of the data signal DQ output by the second acquiring section 52 sequentially in the entries thereof, at a timing of the timing signal generated by the timing generating section 22.

Furthermore, the buffer section 58 outputs the data values DQ of the data signal DQ buffered in the entries thereof, in the order in which the data values were input, at the timing of the timing signal generated according to the test period of the test apparatus 10. The buffer section 58 supplies the judging section 42 with the output data values of the data signal DQ.

The clock generating section 36 and the data acquiring section 38 described above can acquire the data signal DQ output from the device under test 200 at either a timing corresponding to the clock signal DQS or a timing corresponding to the timing signal generated within the test apparatus 10. When the data signal DQ output from the device under test 200 is acquired at a timing corresponding to the clock signal DQS, the clock generating section 36 and the data acquiring section 38 can then switch the timing to output the data values of the acquired data signal DQ at a timing corresponding to the timing signal generated based on the internal clock of the test apparatus 10.

Figure 6:
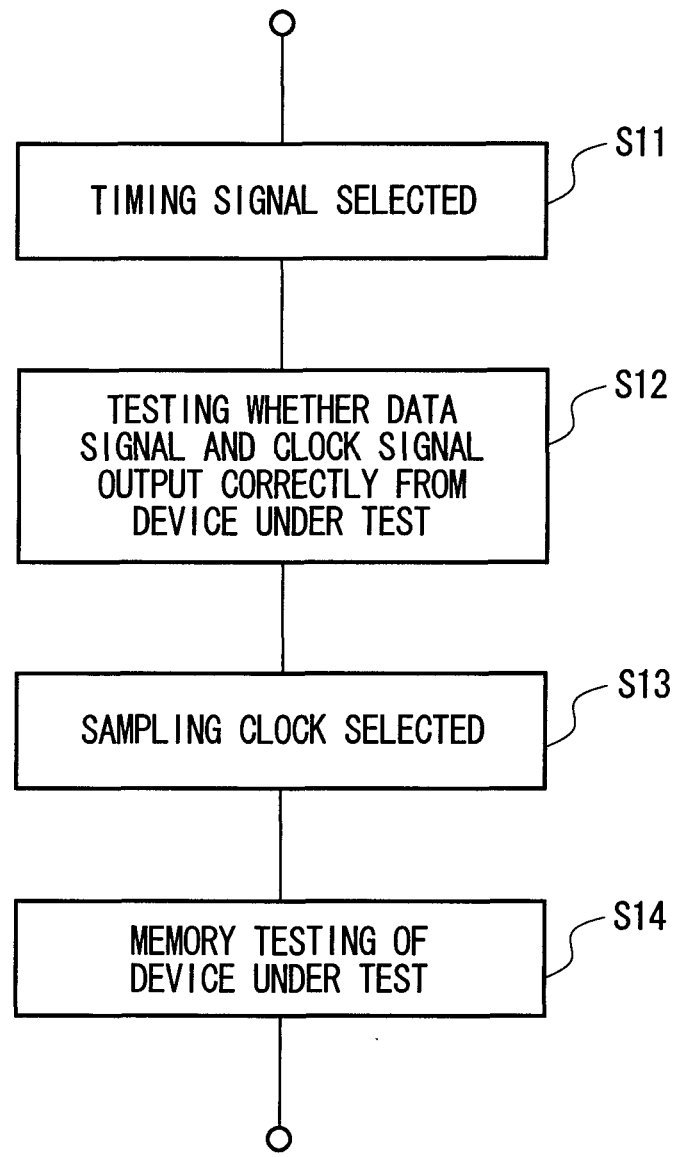
FIG. 6 is a flow chart showing a procedure for testing the device under test 200.

FIG. 6 is a flow chart showing a procedure for testing the device under test 200. When testing a device under test 200 that is a memory device, the test apparatus 10 of the present embodiment performs the following test, for example.

First, at step S11, the test apparatus 10 selects the timing signal generated within the test apparatus 10 as the timing for acquiring the signals output from the device under test 200. Next, at step S12, the test apparatus 10 tests whether the device under test 200 is correctly outputting the clock signal and the data signal. More specifically, the test apparatus 10 causes the device under test 200 to output a data signal and a clock signal, and acquires the waveforms of the clock signal and the data signal at the timing of the timing signal output from the timing generating section 22. The test apparatus 10 judges whether the data signal and the clock signal are output correctly based on measurement results of the acquired waveforms of the data signal and the clock signal.

When the data signal and clock signal are correctly output from the device under test 200, the test apparatus 10 then, at step S13, selects the sampling clock corresponding to the clock signal output from the device under test 200 as the timing for acquiring the signals output from the device under test 200. Next, at step S14, the test apparatus 10 tests whether the device under test 200 is functioning correctly as a memory.

In this way, the test apparatus 10 can acquire the data signal and clock signal output from the device under test 200, at the timing of the timing signal generated within the test apparatus 10. Accordingly, prior to testing the functioning of the device under test 200, the test apparatus 10 can test whether the data signal and the clock signal are operating correctly.

Figure 7:
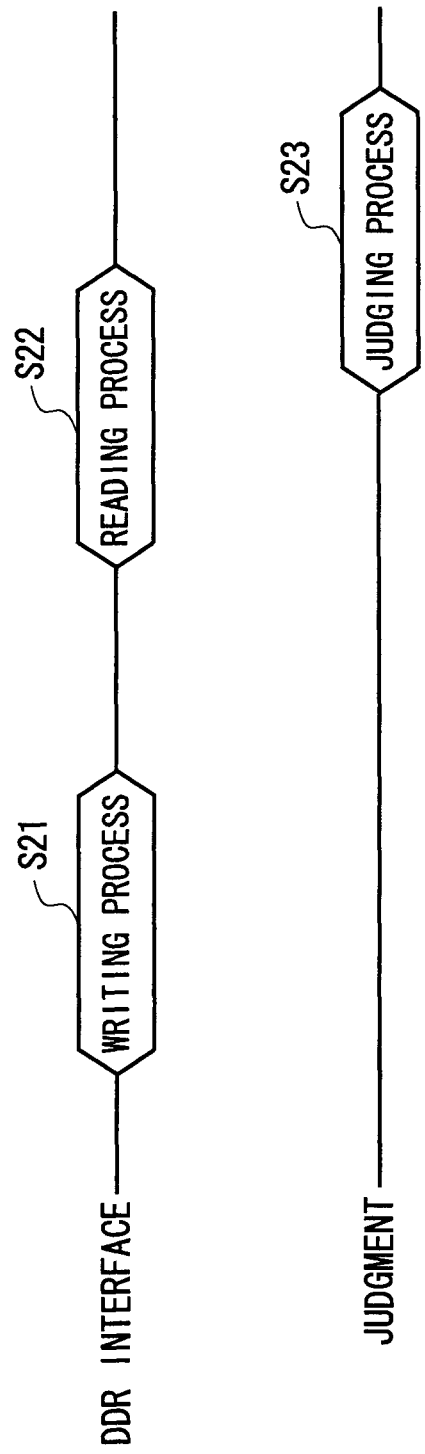
FIG. 7 shows a timing chart of a case in which a function test is performed on a device under test 200 that is a memory device.

FIG. 7 shows a timing chart of a case in which a function test is performed on a device under test 200 that is a memory device. The device under test 200 is a memory device that exchanges data with another device via a DDR interface, which is a bidirectional bus. When testing a device under test 200 that is a memory device, the test apparatus 10 operates in the following manner.

First, at step S21, the test apparatus 10 writes predetermined data to the address region to be tested in the device under test 200. Next, at step S22, the test apparatus 10 reads the data written to the address region to be tested in the device under test 200. At step S23, the test apparatus 10 compares the read data to the expected value and judges whether the address region under test in the device under test 200 is operating correctly. The test apparatus 10 can judge pass/fail of the device under test 200 by performing such a process on all of the address regions in the device under test 200.

Figure 8:
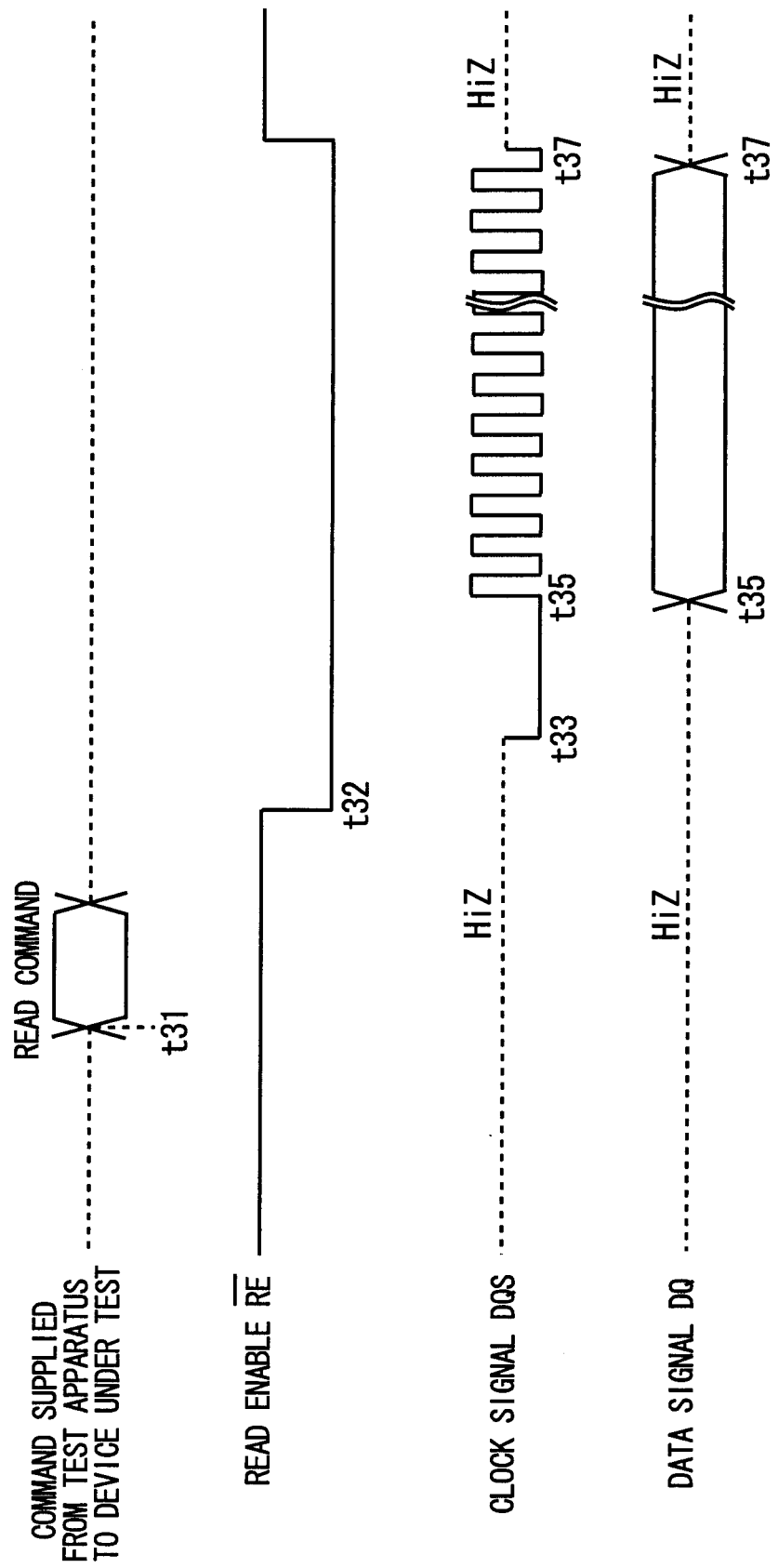
FIG. 8 shows examples of a command and read enable signal transmitted from the test apparatus 10 to the device under test 200, a clock signal and data signal transmitted from the device under test 200 to the test apparatus 10, timing of a mask signal and a sampling clock, and timing of data transmitted from the buffer section 58 to the judging section 42.

FIG. 8 shows examples of a command and read enable signal transmitted from the test apparatus 10 to the device under test 200, a clock signal and data signal transmitted from the device under test 200 to the test apparatus 10, timing of a mask signal and a sampling clock, and timing of data transmitted from the buffer section 58 to the judging section 42. When reading data from a device under test 200 that is a memory device via the DDR interface, the test apparatus 10 performs the following operations.

First, the test signal supplying section 44 of the test apparatus 10 outputs, to the device under test 200 via the DDR interface, the clock signal and data signal indicating the command, e.g. read command, instructing the device under test 200 to output a data signal (time t31). Next, the test signal supplying section 44 supplies the device under test 200 with the read enable signal permitting data output (time t32).

Next, the device under test 200 provided with the read command outputs the data signal DQ including the data value stored at the address indicated by the read command, via the DDR interface, after a prescribed time has passed from when the read command was provided (time t35). Along with this, the device under test 200 outputs the clock signal DQS indicating the sampling timing of the data signal DQ, via the DDR interface (time t35). When the a prescribed number of pieces of data of the data signal DQ has been output, the device under test 200 ends the output of the data signal DQ and the clock signal DQS (time t37).

The device under test 200 has high impedance (HiZ) and does not drive the input/output terminal of the data signal DQ, at all times other than the output time period of the data signal DQ (time t35 to time t37). Furthermore, the device under test 200 fixes the clock signal DQS at a predetermined level, e.g. low logic level, for a prescribed time period (time t33 to time t35) prior to the output time period of the data signal DQ (time t35 to time t37). Furthermore, the device under test 200 has high impedance (HiZ) and does not drive the input/output terminal of the clock signal DQS before the period during which the clock signal DQS is fixed at a predetermined signal level (before time t33) and after the output period of the data signal DQ (time t37).

The data acquiring section 38 of the test apparatus 10 sequentially acquires the data value of the data signal DQ at the timing of the clock signal DQS output from the device under test 200, during a period (time t35 to time t37) in which the device under test 200 outputs the data signal. The data acquiring section 38 sequentially buffers the acquired data in the entries thereof. In the manner described above, during the reading process, the test apparatus 10 can read the data signal DQ from the device under test 200 that is a memory device via the DDR interface, and acquire the data value of the data signal DQ at the timing of the clock signal DQS.

Figure 9:
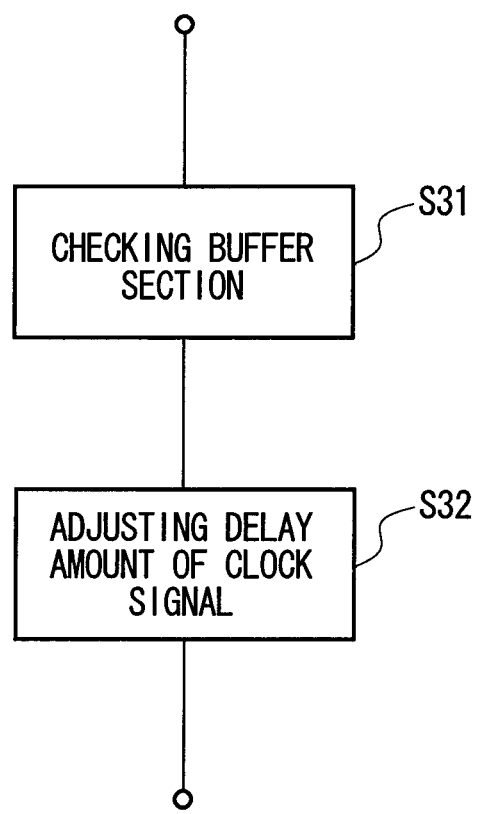
FIG. 9 shows an exemplary process flow of the adjusting in the test apparatus 10 of the present embodiment.

FIG. 9 shows an exemplary process flow of the adjusting in the test apparatus 10 of the present embodiment. Prior to testing the device under test 200, the test apparatus 10 performs the adjustment process on itself. The test apparatus 10 performs the adjustment process in the following manner, for example.

First, at step S31, the test apparatus 10 checks whether the buffer section 58 in each data acquiring section 38 is operating correctly. Next, at step S32, the test apparatus 10 adjusts the delay amount of the clock signal, which is to generate the sampling clock indicating the timing of the data signal acquisition during testing. In this example, the test apparatus 10 adjusts the delay amount of a delay device 62 of the clock generating section 36 in a manner to output a sampling clock that can accurately acquire the data value of a double-rate data signal in the center of the eye opening.

Figure 10:
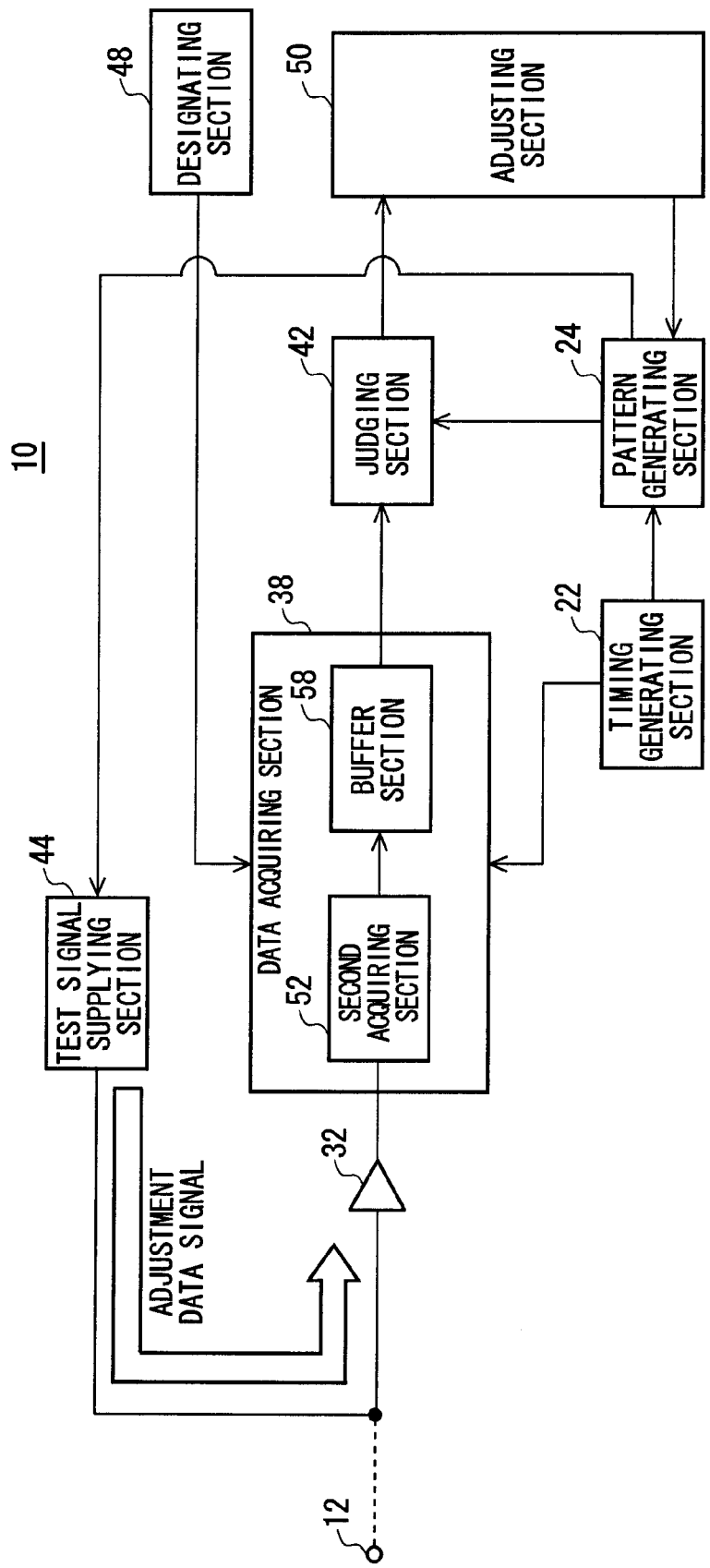
FIG. 10 shows a functional configuration of the test apparatus 10 during the process of checking the buffer section 58 (S31).

FIG. 10 shows a functional configuration of the test apparatus 10 during the process of checking the buffer section 58 (S31). During the process of checking a buffer section 58 at step S31, the designating section 48 designates a data acquiring section 38 to acquire the data signal input via the DDR interface at the timing of the timing signal corresponding to the test period of the test apparatus 10. In this way, at step S31, the data acquiring section 38 acquires the input data signals at the timing of the timing signal output from the timing generating section 22, and buffers the acquired data signals.

Next, the adjusting section 50 causes the test signal supplying section 44 to output an adjustment data signal that has a predetermined data value, and buffer this adjustment data signal in the buffer section 58 of the data acquiring section 38. Here, the data signal output from the test signal supplying section 44 is output to the device under test 200 via the DDR interface that is a bidirectional bus. Accordingly, when the test apparatus 10 is not connected to the device under test 200, the data signal output from the test signal supplying section 44 is looped back and supplied to the corresponding data acquiring section 38. Accordingly, by outputting an adjustment data signal from the test signal supplying section 44 and acquiring the signal input to the data acquiring section 38 at the timing of the timing signal, the adjusting section 50 can cause the adjustment data signal to be buffered in the buffer section 58 of the data acquiring section 38.

Next, the adjusting section 50 checks whether the buffer section 58 is operating correctly, by comparing the data value of the adjustment data signal supplied to the buffer section 58 to the data value of the adjustment data signal buffered in the buffer section 58. For example, the adjusting section 50 may check if the buffer section 58 is operating correctly by transmitting the data value buffered in the buffer section 58 to the judging section 42 and causing the judging section 42 to make a comparison checking whether the data value buffered in the buffer section 58 matches the data value of the adjustment data signal output from the test signal supplying section 44. The adjusting section 50 judges that the buffer section 58 is operating correctly if the data value buffered in the buffer section 58 matches the data value of the adjustment data signal. Furthermore, the adjusting section 50 judges the buffer section 58 to be operating incorrectly when these data values do not match.

When it is judged that the buffer section 58 is not operating correctly, the adjusting section 50 notifies the user that the buffer section 58 is not operating correctly. When it is judged that the adjusting section 50 is operating correctly, the adjusting section 50 proceeds to the process of adjusting the delay amount of the clock signal (S32).

The test apparatus 10 of the present embodiment described above detects whether the buffer sections 58 in the data acquiring sections 38 are operating correctly, prior to testing. Therefore, the test apparatus 10 can test the device under test 200 accurately.

Figure 11:
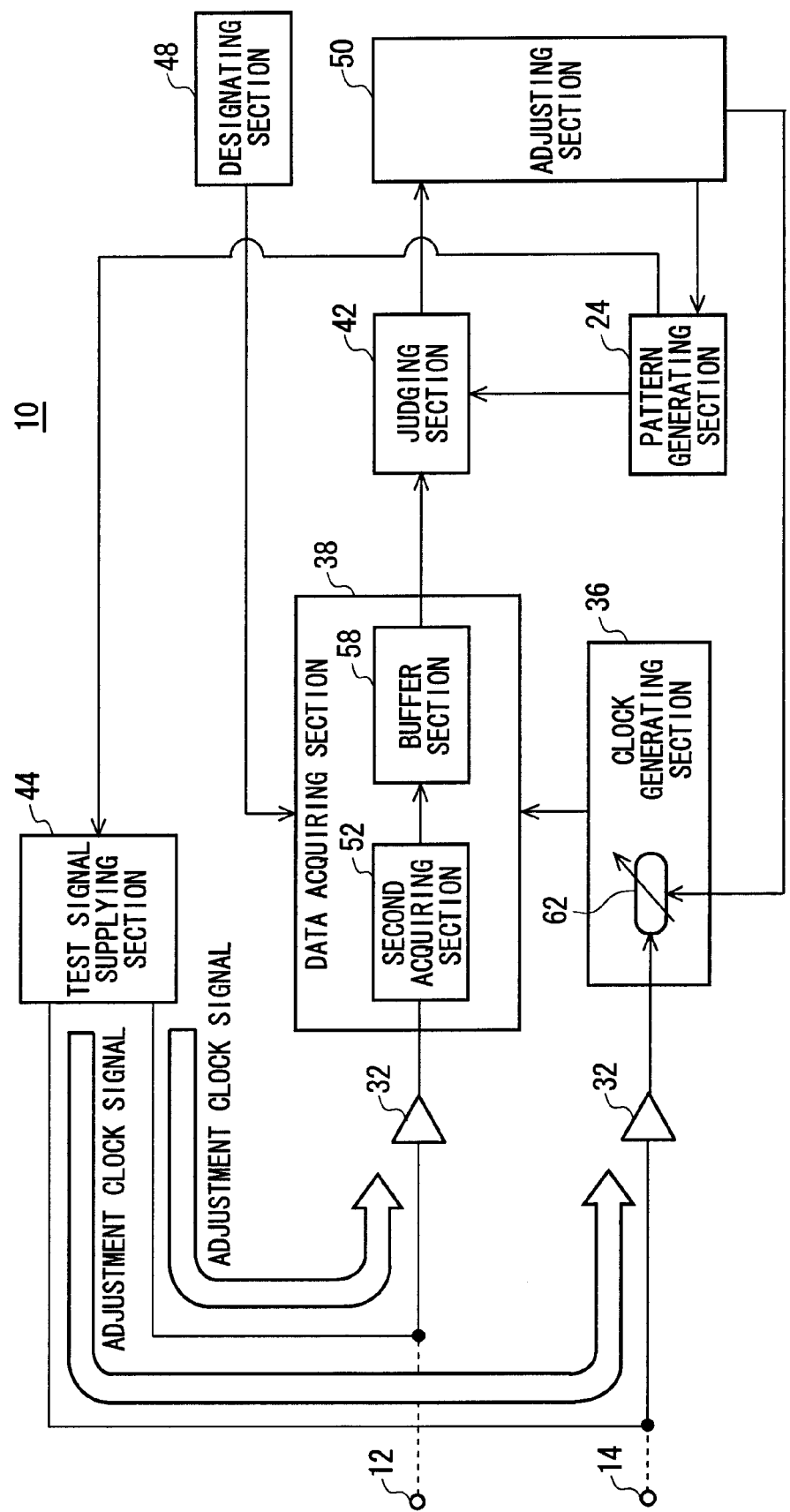
FIG. 11 shows a functional configuration of the test apparatus 10 during the process of adjusting the delay amount of the clock signal (S32).
Figure 12:
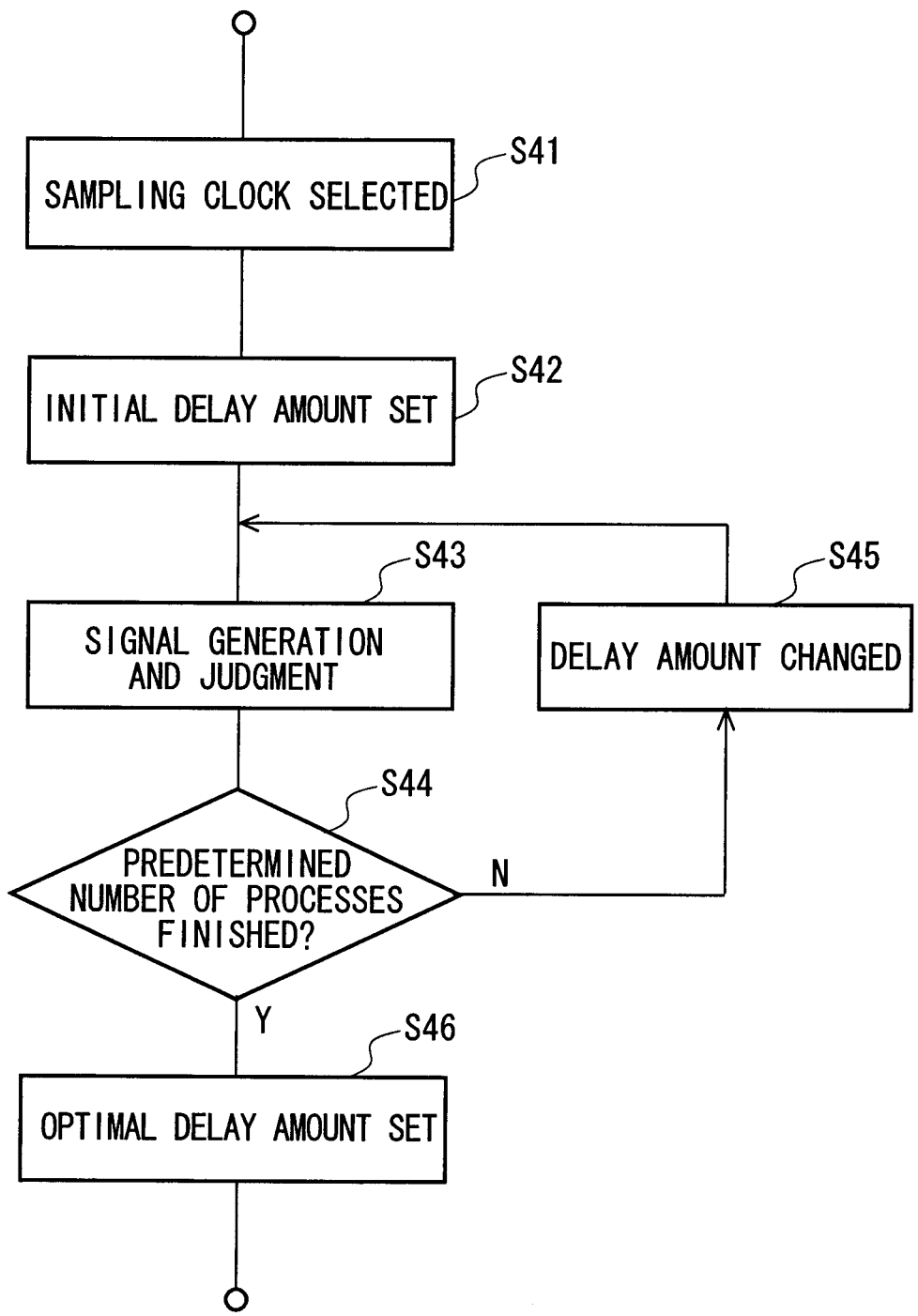
FIG. 12 shows the process flow of the test apparatus 10 during the process of adjusting the delay amount of the clock signal (S32).

FIG. 11 shows a functional configuration of the test apparatus 10 during the process of adjusting the delay amount of the clock signal (S32). FIG. 12 shows the process flow of the test apparatus 10 during the process of adjusting the delay amount of the clock signal (S32). During the process of adjusting the delay amount of the clock signal at step S32, the test apparatus 10 performs processing as shown in FIG. 12.

First, at step S41, the designating section 48 designates a data acquiring section 38 to acquire the data signal input thereto via the DDR interface, at a timing of the sampling clock generated by the clock generating section 36. Therefore, the data acquiring section 38 acquires the input data signal according to the sampling clock generated by the clock generating section 36 and buffers the data signal.

Next, at step S42, the adjusting section 50 sets the delay amount of the delay device 62 in the clock generating section 36 to be a predetermined initial delay amount.

Next, at step S43, the adjusting section 50 causes a predetermined adjustment data signal and adjustment clock signal to be output from the test signal supplying section 44, and causes the data acquiring section 38 to acquire the adjustment data signal at a timing corresponding to the adjustment clock signal. Here, the data signal and clock signal output from the test signal supplying section 44 are output to the device under test 200 via the DDR interface that is a bidirectional bus. Accordingly, when the test apparatus 10 is not connected to the device under test 200, the data signal output from the test signal supplying section 44 is looped back and supplied to the corresponding data acquiring section 38. Furthermore, the clock signal output from the test signal supplying section 44 is looped back and supplied to the clock generating section 36. Accordingly, by causing the adjustment data signal and the adjustment clock signal to be output from the test signal supplying section 44, the adjusting section 50 can cause the data acquiring section 38 to acquire the adjustment data signal at a timing corresponding to the adjustment clock signal.

At step S43, the adjusting section 50 causes the judging section 42 to compare the acquisition result of the data acquiring section 38 to the data value of the adjustment data signal output from the test signal supplying section 44, and judges whether the data acquiring section 38 acquired the correct data value based on the comparison result. For example, the adjusting section 50 may judge that the data acquiring section 38 acquired the correct data if the acquisition result of the data acquiring section 38 matches the data value of the adjustment data signal output from the test signal supplying section 44, and may judge that the data acquiring section 38 was unable to acquire the correct data if these values do not match.

Next, at step S44, the adjusting section 50 judges whether the process of step S43 has been performed a predetermined number of times. If it is judged that the process of step S43 has not been performed the predetermined number of times (the "No" of step S44), the adjusting section 50 proceeds to step S44. At step S45, the adjusting section 50 changes the delay amount of the delay device 62 in the data acquiring section 38. For example, the adjusting section 50 may increase or decrease the delay amount of the delay device 62 by a predetermined change amount. When the process of step S45 is finished, the adjusting section 50 returns to step S43 and again performs the process of step S43.

When it is judged at step S44 that the process has been performed the predetermined number of times (the "Yes" of step S44), the adjusting section 50 proceeds to the process of step S46. At step S46, the adjusting section 50 adjusts the delay amount of the clock signal for generating the timing of the data signal acquisition, based on the acquisition results of the adjustment data signal by the data acquiring section 38.

More specifically, the adjusting section 50 detects an optimal delay amount of the delay device 62 based on the judgment result of step S43 and the delay amount of the delay device 62 set when the judgment result was obtained. For example, the adjusting section 50 may detect, as the optimal delay amount, the substantial center of a range of delay amounts for which it was judged that the data acquiring section 38 was able to acquire the correct data. The adjusting section 50 then sets the delay device 62 to delay the clock signal by the detected optimal delay amount.

The test apparatus 10 according to the present embodiment described above can set an optimal value for the delay amount of the delay device 62 in the clock generating section 36, prior to testing. Therefore, the test apparatus 10 can accurately acquire the data signal output from the device under test 200, at the timing of the clock signal output from the device under test 200.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test exchanging, with the test apparatus, a data signal and a clock signal indicating a timing at which the data signal is to be sampled, via a bidirectional bus, the test apparatus comprising:
a test signal supplying section that supplies the device under test with a data signal and a clock signal, as a test signal, via the bidirectional bus;
a data acquiring section that acquires the data signal output via the bidirectional bus by the device under test, at a timing corresponding to the clock signal output via the bidirectional bus by the device under test;
a judging section that judges pass/fail of the device under test based on a comparison result of a comparison between the data signal acquired by the data acquiring section and an expected value; and
an adjusting section that, when performing an adjustment, causes the test signal supplying section to output an adjustment data signal and an adjustment clock signal, causes the data acquiring section to acquire the adjustment data signal at a timing corresponding to the adjustment clock signal, and adjusts a delay amount of the clock signal used to generate the timing at which the data signal is acquired, based on an acquisition result of the adjustment data signal by the data acquiring section.

2. The test apparatus according to claim 1, further comprising a clock generating section that includes a delay device outputting a delay signal obtained by delaying the clock signal output from the device under test and that generates a sampling clock indicating a timing at which the data signal output from the device under test is to be sampled, based on the delay signal, wherein
the data acquiring section acquires the data signal output by the device under test, at the timing of the sampling clock, and
when performing the adjustment, the adjusting section causes the clock generating section to generate a sampling clock corresponding to the adjustment clock signal by supplying the clock generating section with the adjustment clock signal, causes the data acquiring section to acquire the adjustment data signal at the timing of the sampling clock corresponding to the adjustment clock signal, and adjusts a delay amount of the delay device based on the acquisition result of the adjustment data signal acquired by the data acquiring section at the timing of the sampling clock corresponding to the adjustment clock signal.

3. A test method performed by a test apparatus that tests a device under test exchanging a data signal and a clock signal indicating a timing at which the data signal is to be sampled with the test apparatus, via a bidirectional bus, wherein the test apparatus comprises:
a test signal supplying section that supplies the device under test with a data signal and a clock signal, as a test signal, via the bidirectional bus;
a data acquiring section that acquires the data signal output via the bidirectional bus by the device under test, at a timing corresponding to the clock signal output via the bidirectional bus by the device under test; and
a judging section that judges pass/fail of the device under test based on a comparison result of a comparison between the data signal acquired by the data acquiring section and an expected value, the test method comprising:
when performing an adjustment, causing the test signal supplying section to output an adjustment data signal and an adjustment clock signal, and causing the data acquiring section to acquire the adjustment data signal at a timing corresponding to the adjustment clock signal; and
adjusting a delay amount of the clock signal used to generate the timing at which the data signal is acquired, based on an acquisition result of the adjustment data signal by the data acquiring section.

* * * * *